United States Patent
Ha

(10) Patent No.: US 7,573,755 B2
(45) Date of Patent: Aug. 11, 2009

(54) DATA AMPLIFYING CIRCUIT FOR SEMICONDUCTOR INTEGRATED CIRCUIT

(75) Inventor: Sung-Joo Ha, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 208 days.

(21) Appl. No.: 11/822,813

(22) Filed: Jul. 10, 2007

(65) Prior Publication Data

US 2008/0136459 A1 Jun. 12, 2008

(30) Foreign Application Priority Data

Dec. 8, 2006 (KR) ...................... 10-2006-0124458

(51) Int. Cl.
*G11C 7/08* (2006.01)
(52) U.S. Cl. .................. 365/189.15; 365/208; 365/207; 365/205; 365/190; 365/201; 365/194; 327/55; 327/52; 327/57
(58) Field of Classification Search ................ 365/190, 365/205, 208, 207, 201, 189.15, 189.05, 365/189.07, 194; 327/55, 54, 52, 57
See application file for complete search history.

(56) References Cited

U.S. PATENT DOCUMENTS

| 5,966,337 | A | 10/1999 | Lee et al. | |
|---|---|---|---|---|
| 6,043,685 | A | 3/2000 | Lee | |
| 6,097,653 | A | 8/2000 | Park | |
| 6,347,058 | B1 | 2/2002 | Houghton et al. | |
| 6,373,744 | B1 * | 4/2002 | Mano | 365/145 |
| 7,109,775 | B2 * | 9/2006 | Tomita | 327/278 |
| 7,266,030 | B2 * | 9/2007 | Do et al. | 365/207 |

FOREIGN PATENT DOCUMENTS

| JP | 10340583 | 12/1998 |
|---|---|---|
| JP | 2006031922 | 2/2006 |
| KR | 1019990048862 | 7/1999 |

* cited by examiner

*Primary Examiner*—Andrew Q Tran
(74) *Attorney, Agent, or Firm*—Venable LLP; Jeffri A. Kaminski

(57) ABSTRACT

A data amplifying circuit for a semiconductor integrated circuit including a controller configured to generate a control signal for adjusting an amplification step in response to a test signal, and a data amplifier configured to amplify an input signal one time or two or more times in response to the control signal and to output an output signal.

21 Claims, 4 Drawing Sheets

DATA AMPLIFYING CIRCUIT FOR SEMICONDUCTOR INTEGRATED CIRCUIT

CROSS-REFERENCE TO RELATED PATENT APPLICATION

This application claims the benefit of Korean Patent Application No. 10-2006-0124458, filed on Dec. 8, 2006, in the Korean Intellectual Property Office, the disclosure of which is incorporated herein in its entirety by reference.

BACKGROUND OF THE INVENTION

1. Technical Field

The present invention relates to a semiconductor integrated circuit, and in particular, to a data amplifying circuit.

2. Related Art

A semiconductor integrated circuit amplifies bitline signals using a bitline sense amplifier (hereinafter, referred to as "BLSA") and transmits the amplified bitline signals through a local input/output line (LIO). The signals LIO/LIOb to be transmitted through the local input/output line usually have levels inverted with respect to each other.

An input/output sense amplifier (hereinafter, referred to as "IOSA") amplifies the signals LIO/LIOb of the local input/output line and transmits the amplified signals through the global input/output line. The IOSA uses a two-stage amplification configuration that amplifies the signals LIO/LIOb of the local input/output line using a current mirror type amplifier, and then amplifies the signals to high and low levels using a cross coupled type amplifier. Alternatively, the IOSA may also use a one-stage amplification configuration that amplifies the signals of the local input/output line using only the cross coupled type amplifier and transmits the amplified signals through the global input/output line.

Generally, the load of the local input/output line is larger than the driving ability of the BLSA. Accordingly, the signals LIO/LIOb of the local input/output line that are input to the IOSA have low voltage levels.

A current mirror type amplifier amplifies a difference between two input signals by an amount corresponding to a gain characteristic to the amplifier. Accordingly, even though the difference between the two signals is small and the values of the two signals are instantaneously changed due to offset or noise, if the input signals return to a normal condition, the output of the amplifier also returns to a normal condition. Therefore, while the signals of the local input/output line can be amplified starting from when the difference between the two signals is small, an amplification level is small at that time. As a result, the high and low levels cannot be output.

In a cross coupled type amplifier, if the values of the two input signals are instantaneously changed, even if the two input signals return to the normal condition, the output may be erroneously amplified due to an amplification operation caused by internal feedback. Therefore, for normal operation, the amplifier needs to start to operate after the difference between the two input signals is sufficiently large.

When two-stage amplification configuration is used, the IOSA can use the advantages of the current mirror type amplifier and the cross coupled type amplifier together. For example, when the difference in the potential between the input signals transmitted through the local input/output line is small, the current mirror type amplifier first amplifies the difference between the input signals, and subsequently the cross coupled type amplifier additionally amplifies the amplified signal output from the current mirror type amplifier. Therefore, the output signal at the high and low levels is output.

When the two-stage amplification configuration is used, an operation speed is faster in a case where the current mirror type amplifier amplifies the difference in advance than in a case where the BLSA waits until the difference in the potential between the local input/output line becomes sufficiently large. Therefore, since the signals of the local input/output line are transmitted to the global input/output line, the total amplification speed is fast. In this case, however, a circuit area is large and power consumption increases.

When the IOSA uses the one-stage amplification configuration, the BLSA waits until a difference in potential between the signals of the local input/output line becomes sufficiently large. Therefore, a speed that the signals of the local input/output line are transmitted is slow through the global input/output line, while the circuit area is small and current consumption is low.

However, in a general semiconductor integrated circuit, upon design, one of an IOSA using the two-stage amplification configuration and an IOSA using the one-stage amplification configuration is selectively used according to the requirements, such as the operation speed, the area, and current consumption of the circuit. Meanwhile, a change in requirements may be needed after design is completed (for example, current consumption needs to be reduced even if the operation speed becomes slow). Thus, when the IOSA using the two-stage amplification configuration is substituted with the IOSA using the one-stage amplification configuration, there is no method of pre-testing trouble during the operation. Further, a change in the amplification configuration is accompanied by a new circuit arrangement.

SUMMARY OF THE INVENTION

Embodiments of the invention provide a data amplifying circuit for a semiconductor integrated circuit that can control a number of amplifications of an input signal in response to a test result.

An embodiment of the invention provides a data amplifying circuit for a semiconductor integrated circuit including a controller that generates a control signal for adjusting an amplification step in response to a test signal, and a data amplifier that amplifies an input signal one time or two or more times in response to the control signal and outputs an output signal.

Another embodiment of the invention provides a data amplifying circuit for a semiconductor integrated circuit includes an amplification step fixer that outputs an amplification step fixing signal, an amplification controller that outputs a control signal for controlling an amplification step in response to a driving signal, a test signal, and the amplification step fixing signal, and a data amplifier that amplifies an input signal one time or two or more times in response to the control signal and outputs an output signal.

DESCRIPTION OF EXEMPLARY EMBODIMENT

Hereinafter, exemplary embodiments of the invention will be described in detail with reference to the accompanying drawings.

Figure 1:
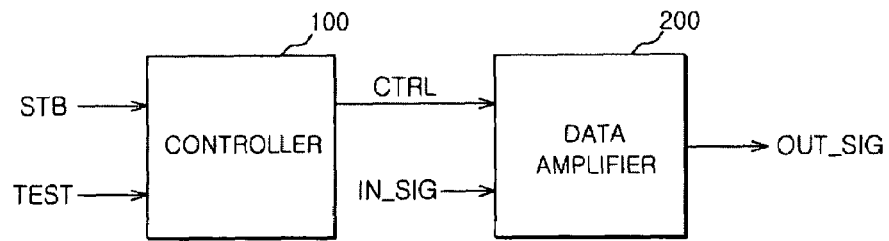
FIG. 1 is an internal block diagram of a data amplifying circuit for a semiconductor integrated circuit according to an embodiment of the invention.

Referring to FIG. 1, a data amplifying circuit for a semiconductor integrated circuit according to an embodiment of the invention includes a controller 100 and a data amplifier 200.

The controller 100 generates a control signal CTRL for adjusting an amplification step in response to a test signal TEST and a driving signal STB.

The data amplifier 200 amplifies an input signal IN_SIG one time or at least two times in response to the control signal CTRL and outputs an output signal OUT_SIG.

The data amplifying circuit according to an embodiment of the invention shown in FIG. 1 controls the amplification step of the data amplifier 200 according to whether the test signal TEST is enabled or disabled.

The test signal TEST is a signal that is generated during a test mode.

The input signal IN_SIG is a signal that is transmitted through a local input/output line, and the output signal OUT_SIG is a signal that is transmitted through a global input/output line.

Figure 2:
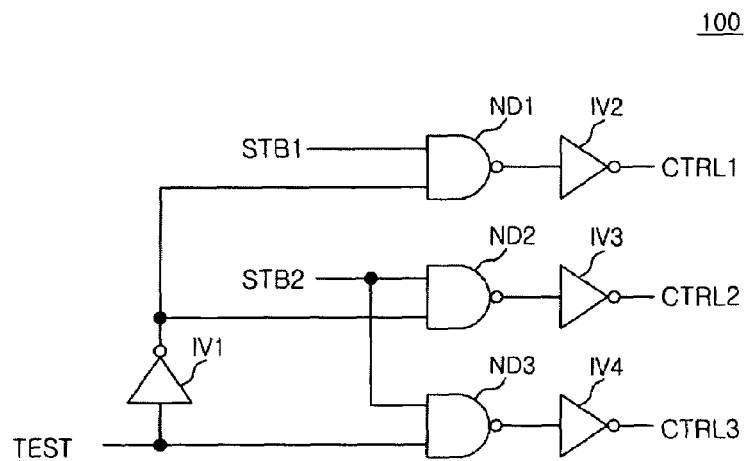
FIG. 2 is an internal circuit diagram of a controller shown in FIG. 1.

Referring to FIG. 2, the driving signal STB includes a first driving signal STB1 and a second driving signal STB2. Further, the control signal CTRL includes a first control signal CTRL1, a second control signal CTRL2, and a third control signal CTRL3.

If the test signal TEST is inactivated, the controller 100 outputs the first control signal CTRL1 and the second control signal CTRL2 that are activated in response to the first driving signal STB1 and the second driving signal STB2, respectively, and outputs the third control signal CTRL3 that is inactivated. Further, if the test signal TEST is activated, the controller 100 outputs the first control signal CTRL1 and the second control signal CTRL2 that are inactivated, and outputs the third control signal CTRL3 that is activated in response to the second driving signal STB2.

The controller 100 includes first to fourth inverters IV1 to IV4 and first to third NAND gates ND1 to ND3.

The first inverter IV1 inverts and outputs the test signal TEST.

The first NAND gate ND1 has one input, to which the first driving signal STB1 is input, and the other input connected to an output of the first inverter IV1. Further, the second inverter IV2 has an input connected to an output of the first NAND gate ND1 and an output, from which the first control signal CTRL1 is output.

The second NAND gate ND2 has one input, to which the second driving signal STB2 is input, and the other input connected to the output of the first inverter IV1. Further, the third inverter IV3 has an input connected to an output of the second NAND gate ND2 and an output, from which the second control signal CTRL2 is output.

The third NAND gate ND3 has one input, to which the second driving signal STB2 is input, and the other input, to which the test signal TEST is input. Further, the fourth inverter IV4 has an input connected to an output of the third NAND gate ND3 and an output, from which the third control signal CTRL3 is output.

Figure 3:
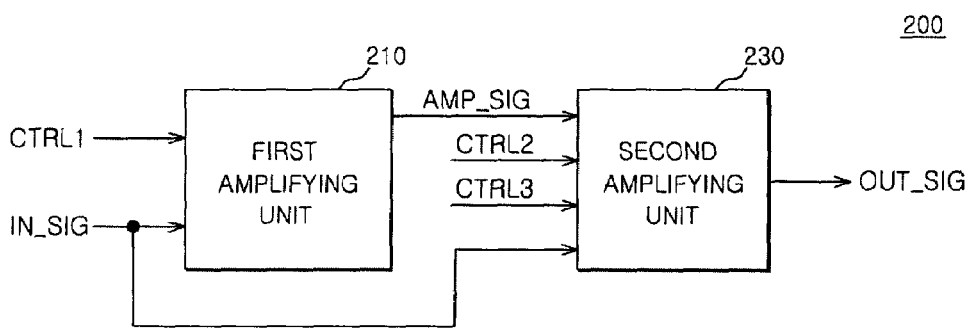
FIG. 3 is an internal block diagram of a data amplifier shown in FIG. 1.

Referring to FIG. 3, the data amplifier 200 includes a first amplifying unit 210 and a second amplifying unit 230.

The first amplifying unit 210 amplifies the input signal IN_SIG in response to the first control signal CTRL1 and outputs an amplification signal AMP_SIG.

The first amplifying unit 210 may be implemented by an amplifier that amplifies the input signal IN_SIG in response to the first control signal CTRL1. For example, the first amplifying unit 210 may be implemented by a current mirror type amplifier.

The second amplifying unit 230 additionally amplifies the amplification signal AMP_SIG in response to the second control signal CTRL2 and the third control signal CTRL3, and outputs the output signal OUT_SIG, or amplifies the input signal IN_SIG and outputs the output signal OUT_SIG.

The second amplifying unit 230 may be implemented by an amplifier that can selectively amplify the amplification signal AMP_SIG or the input signal IN_SIG in response to the second control signal CTRL2 and the third control signal CTRL3. For example, the second amplifying unit 230 may be a cross coupled type amplifier.

Figure 4:
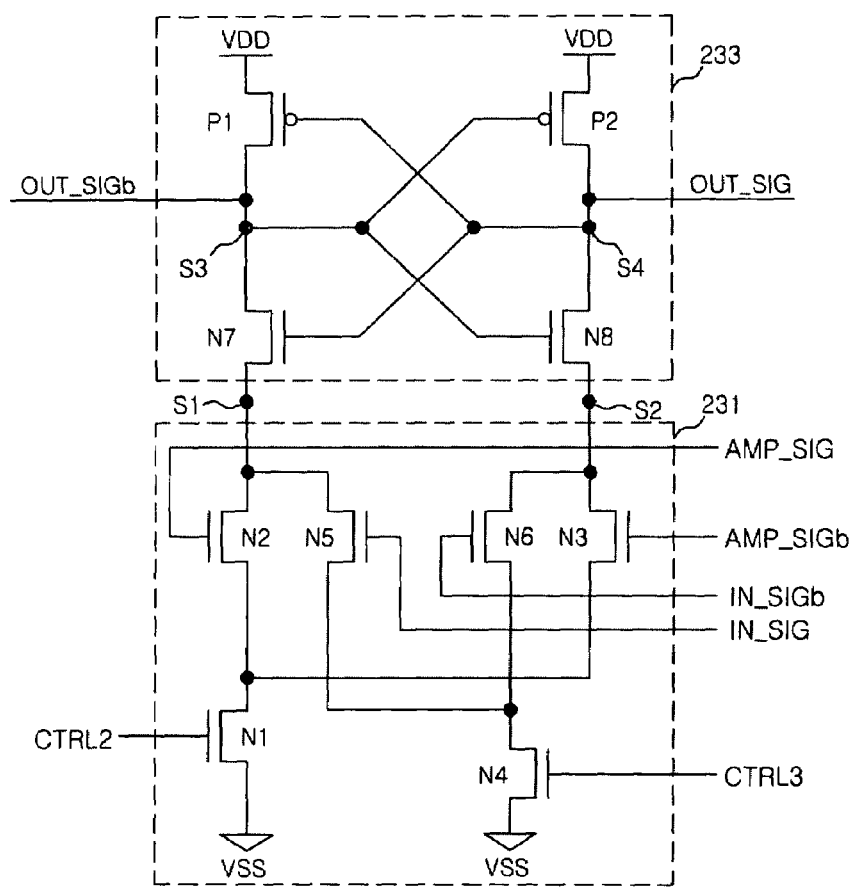
FIG. 4 is an internal circuit diagram of a second amplifying unit shown in FIG. 3.

Referring to FIG. 4, the second amplifying unit 230 includes a comparing portion 231 and an output signal amplifying portion 233.

The comparing portion 231 changes the potential levels of a first node S1 and a second node S2 in response to the second control signal CTRL2 and the amplification signal AMP_SIG or changes the potential levels of the first node S1 and the second node S2 in response to the third control signal CTRL3 and the input signal IN_SIG.

The output signal amplifying portion 233 amplifies the variations in potential of the first node S1 and the second node S2, to output the output signal OUT_SIG.

According to an embodiment of the present invention shown in FIG. 4, the second amplifying unit 230 is configured to simultaneously receive the input signal IN_SIG and an inverted input signal IN_SIGb at a level inverted with respect to the input signal IN_SIG, or simultaneously receive the amplification signal AMP_SIG and an inverted amplification signal AMP_SIGb at a level inverted with respect to the amplification signal AMP_SIG, and to simultaneously output the output signal OUT_SIG and an inverted output signal OUT_SIGb at a level inverted with respect to the output signal OUT_SIG.

The comparing portion 231 includes first to sixth transistors N1 to N6.

The first transistor N1 has a gate, to which the second control signal CTRL2 is input, and a source connected to a ground VSS. Further, the second transistor N2 has a gate, to which the amplification signal AMP_SIG is input, a drain connected to the first node S1, and a source connected to a drain of the first transistor N1.

The third transistor N3 has a gate, to which the inverted amplification signal AMP_SIGb is input, a drain connected to the second node S2, and a source connected to the drain of the first transistor N1. Further, the fourth transistor N4 has a gate, to which the third control signal CTRL3 is input, and a source connected to the ground VSS.

The fifth transistor N5 has a gate, to which the input signal IN_SIG is input, a drain connected to the first node S1, and a source connected to a drain of the fourth transistor N4. Further, the sixth transistor N6 has a gate, to which the inverted input signal IN_SIGb is input, a drain connected to the second node S2, and a source connected to the drain of the fourth transistor N4.

The output signal amplifying portion 233 includes seventh to tenth transistors P1, N7, P2, and N8.

The seventh transistor P1 has a source, to which an external supply voltage VDD is applied, a drain connected to a first output node S3, and a gate connected to a second output node S4.

The eighth transistor N7 has a drain connected to the first output node S3, a gate connected to the second output node S4, and a source connected to the first node S1.

The ninth transistor P2 has a source, to which the external supply voltage VDD is applied, a gate connected to the first output node S3, and a drain connected to the second output node S4.

The tenth transistor N8 has a drain connected to the second output node S4, a gate connected to the first output node S3, and a source connected to the second node S2.

The inverted output signal OUT_SIGb is output from the first output node S3, and the output signal OUT_SIG is output from the second output node S4.

The operation of the data amplifying circuit according to an embodiment of the present invention will now be described with reference to FIGS. 1 to 4.

During a normal mode in which the test signal TEST is inactivated, the data amplifying circuit according to an embodiment of the invention amplifies the input signal IN_SIG two or more times to output the output signal OUT_SIG. Further, during a test mode in which the test signal TEST is activated, the data amplifying circuit for a semiconductor integrated circuit amplifies the input signal IN_SIG one time and outputs the output signal OUT_SIG. At this time, it is possible to determine one method of which IN_SIG can be amplified one time or two or more times suitable for the operation speed and current consumption of the semiconductor integrated circuit.

Specifically, the controller 100 receives the test signal TEST, the first driving signal STB1, and the second driving signal STB2 to output the first to third control signals CTRL1 to CTRL3. At this time, the first driving signal STB1 is a signal that is activated when the input signal IN_SIG is primarily amplified, and the second driving signal STB2 is a signal that is activated when the primarily amplified input signal IN_SIG is secondarily amplified.

As shown in FIG. 2, the controller 100 performs an AND operation with respect to an inverted signal of the test signal TEST and the first driving signal STB1, and the inverted signal of the test signal TEST and the second driving signal STB2. Then, the controller 100 outputs the first control signal CTRL1 and the second control signal CTRL2. Further, the controller 100 performs an AND operation with respect to the test signal TEST and the second driving signal STB2 to output the third control signal CTRL3.

That is, if the test signal TEST is activated at a high level, the first control signal CTRL1 and the second control signal CTRL2 are inactivated at a low level, and the third control signal CTRL3 is activated or inactivated in response to the second driving signal STB2. Further, if the test signal TEST is inactivated at a low level, the first control signal CTRL1 and the second control signal CTRL2 are activated in response to the first driving signal STBL and the second driving signal STB2, respectively, and the third control signal CTRL3 is inactivated at a low level regardless of the second driving signal STB2.

Referring to FIG. 3, the first amplifying unit 210 amplifies the input signal IN_SIG in response to the first control signal CTRL1 to output the amplification signal AMP_SIG.

The second amplifying unit 230 amplifies the input signal IN_SIG in response to the second control signal CTRL2 and the third control signal CTRL3 to output an amplified signal as the output signal OUT_SIG, or additionally amplifies the amplification signal AMP_SIG to output an additionally amplified amplification signal as the output signal OUT_SIG.

When the test signal TEST is activated, the first control signal CTRL1 and the second control signal CTRL2 are inactivated, and thus the first amplifying unit 210 is inactivated and does not output the amplification signal AMP_SIG. Then, the second amplifying unit 230 amplifies the input signal IN_SIG one time in response to the third control signal CTRL3 and outputs the output signal OUT_SIG. Meanwhile, when the test signal TEST is inactivated, the third control signal CTRL3 is inactivated, and thus the first amplifying unit 210, which is activated in response to the first control signal CTRL1, amplifies the input signal IN_SIG and outputs the amplification signal AMP_SIG. Then, the second amplifying unit 230 additionally amplifies the amplification signal AMP_SIG in response to the second control signal CTRL2 and outputs the additionally amplified amplification signal.

The operation of the second amplifying unit 230 will now be described in detail with reference to FIG. 4.

It is assumed that the input signal IN_SIG and the amplification signal AMP_SIG are all at the high level, and the inverted input signal IN_SIGb and the inverted amplification signal AMP_SIGb are at the low level.

When the second driving signal STB2 is activated, the second control signal CTRL2 and the third control signal CTRL3 to be input to the comparing portion 231 have levels inverted with respect to each other. That is, when the second driving signal STB2 is activated and the second control signal CTRL2 is activated, the third control signal CTRL3 is inactivated. Further, when the second driving signal STB2 is activated and the second control signal CTRL2 is inactivated, the third control signal CTRL3 is activated.

When the second control signal CTRL2 is activated, the first transistor N1 is turned on, and the amplification signal AMP_SIG is input to the second transistor N2 to change the potential of the first node S1. Further, the inverted amplification signal AMP_SIGb is input to the third transistor N3 to change the potential of the second node S2. At this time, since the potential of the first output node S3 becomes relatively lower than the potential of the second output node S4, the ninth transistor P2 is gradually turned on to increase the potential of the second output node S4. Further, the eighth transistor is gradually turned on to decrease the potential of the first output node S3. That is, the output signal amplifying portion 233 outputs the output signal OUT_SIG and the inverted output signal OUT_SIGb according to the potential of the first node S1 and the potential of the second node S2 through a repetitive feedback operation.

When the second control signal CTRL2 is inactivated, the third control signal CTRL3 is activated. Accordingly, the fourth transistor N4 is turned on in response to the third control signal CTRL3, and the input signal IN_SIG is input to the fifth transistor N5 to change the potential of the first node S1. Further, the inverted input signal IN_SIGb is input to the sixth transistor N6 to change the potential of the second node S2. At this time, since the potential of the first output node S3 becomes relatively lower than the potential of the second output node S4, the ninth transistor P2 is gradually turned on to increase the potential of the second output node S4. Further, the eighth transistor N7 is gradually turned on to decrease the potential of the first output node S3. That is, the output signal amplifying portion 233 outputs the output signal OUT_SIG and the inverted output signal OUT_SIGb according to the potential of the first node S1 and the potential of the second node S2 through a repetitive feedback operation.

Figure 5:
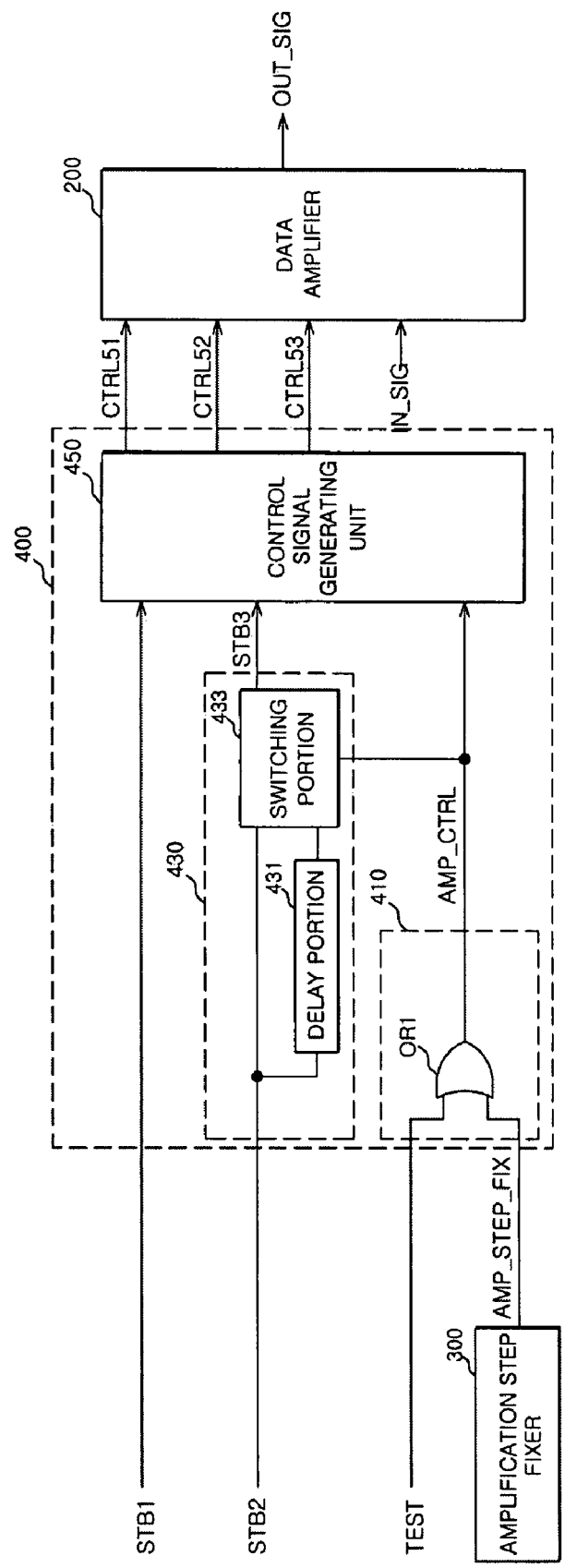
FIG. 5 is an internal circuit diagram of a data amplifying circuit for a semiconductor integrated circuit according to another embodiment of the invention.

FIG. 5 is an internal circuit diagram of a data amplifying circuit for a semiconductor integrated circuit according to another embodiment of the invention.

The data amplifying circuit for a semiconductor integrated circuit according to another embodiment of the present invention shown in FIG. 5 includes an amplification step fixer 300, an amplification controller 400, and a data amplifier 200.

The amplification step fixer 300 outputs an amplification step fixing signal AMP_STEP_FIX.

The amplification controller 400 outputs a control signal CTRL_N for adjusting an amplification step in response to a driving signal STB, a test signal TEST, and the amplification step fixing signal AMP_STEP_FIX.

The data amplifier 200 amplifies an input signal IN_SIG one time or at least two times in response to the control signal CTRL_N to output an output signal OUT_SIG.

According to an embodiment of the invention, for example, the driving signal STB includes a first driving signal STB1 and a second driving signal STB2, and the control signal CTRL_N includes a first control signal CTRL51, a second control signal CTRL52, and a third control signal CTRL53.

The amplification step fixer 300 fixes the amplification step fixing signal AMP_STEP_FIX to a specific level according to a test result and outputs the amplification step fixing signal AMP_STEP_FIX at the fixed level. For example, the amplification step fixer 300 includes a fuse and continues to output the fixed level by disconnecting the fuse and leaving the fuse connected according to the test result.

The amplification controller 400 includes an amplification control signal generating unit 410, a delay control unit 430, and a control signal generating unit 450.

The amplification control signal generating unit 410 outputs an amplification control signal AMP_CTRL in response to the test signal TEST and the amplification step fixing signal AMP_STEP_FIX.

The delay control unit 430 controls a transmission time of the second driving signal STB2 in response to the amplification control signal AMP_CTRL to output the controlled second driving signal as the third driving signal.

The control signal generating unit 450 generates the first control signal CTRL51 in response to the amplification control signal AMP_CTRL and the first driving signal STB1, to output the second control signal CTRL2 and the third control signal CTRL3 in response to the amplification control signal AMP_CTRL and the second driving signal STB2.

If the test signal TEST is inactivated, the control signal generating unit 450 outputs the first control signal CTRL51 and the second control signal CTRL52 that are activated in response to the first driving signal STB1 and the third driving signal STB3, respectively, and outputs the third control signal CTRL53 that is inactivated. Further, if the test signal TEST is activated, the control signal generating unit 450 outputs the first control signal CTRL51 and the second control signal CTRL52 that are inactivated, and outputs the third control signal CTRL53 that is activated in response to the third driving signal STB3.

The amplification control signal generating unit 410 receives the test signal TEST and the amplification step fixing signal AMP_STEP_FIX to output the amplification control signal AMP_CTRL. The amplification control signal generating unit 410 may be formed of an OR gate OR1 so as to output the activated amplification control signal AMP_CTRL when the test signal TEST or the amplification step fixing signal AMP_STEP_FIX is activated The delay control unit 430 includes a delay portion 431 and a switching portion 433.

The delay portion 431 outputs the second driving signal STB2 with a time delay for a predetermined time. Further, the switching portion 433 outputs the second driving signal STB2 as the third driving signal STB3 in response to the amplification control signal AMP_CTRL, or outputs an output signal of the delay portion 431 as the third driving signal STB3.

Figure 6:
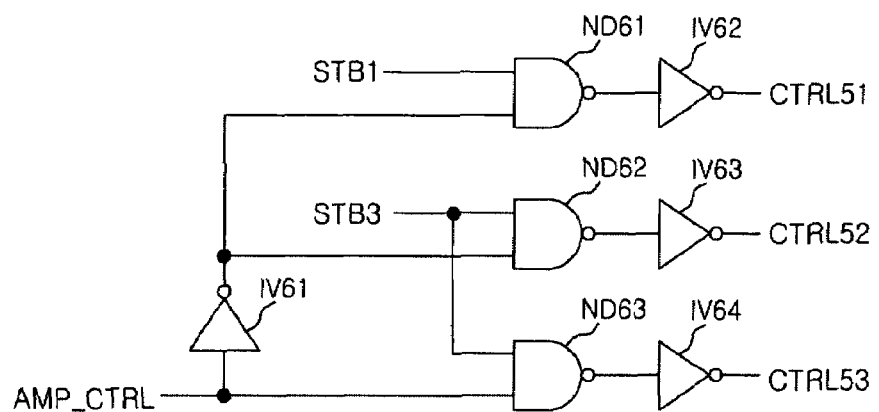
FIG. 6 is an internal circuit diagram of a control signal generating unit shown in FIG. 5.

FIG. 6 is an internal circuit diagram of the control signal generating unit 450 shown in FIG. 5.

The control signal generating unit 450 includes first to fourth inverters IV61 to IV64 and first to third NAND gates ND61 to ND63.

The first inverter IV61 inverts the amplification control signal AMP_CTRL and outputs the inverted amplification control signal.

The first NAND gate ND61 receives the first driving signal STB1 and an output signal of the first inverter IV61.

The second inverter IV62 inverts an output signal of the first NAND gate ND61 to output the first control signal CTRL51.

The second NAND gate ND62 receives the third driving signal STB3 and the output signal of the first inverter IV61.

The third inverter IV63 inverts an output signal of the second NAND gate ND62 to output the second control signal CTRL52.

The third NAND gate ND63 receives the third driving signal STB3 and the amplification control signal AMP_CTRL.

The fourth inverter IV64 has an input connected to an output of the third NAND gate ND63, and an output, from which the third control signal CTRL53 is output.

The data amplifier 200 has the same configuration as shown in FIGS. 3 and 4, and the first to third control signals CTRL1 to CTRL3 shown in FIGS. 3 and 4 are substituted with the first to third control signals CTRL51 to CTRL53 shown in FIG. 6. Accordingly, in respects to the data amplifier 200, the description given with reference to FIGS. 3 and 4 can be referred to.

The operation of the data amplifying circuit for a semiconductor integrated circuit according to another embodiment of the invention will now be described with reference to the accompanying drawings.

During a normal mode in which the test signal TEST is inactivated, the data amplifying circuit for a semiconductor integrated circuit according to another embodiment of the invention amplifies the input signal IN_SIG two or more times and outputs the output signal OUT_SIG. Meanwhile, during a test mode in which the test signal TEST is activated, the data amplifying circuit amplifies the input signal IN_SIG one time and outputs the output signal OUT_SIG. At this time, it is possible to determine one method of which IN_SIG can be amplified one time or two or more times suitable for the operation speed and current consumption of the semiconductor integrated circuit. A number of amplifications in the data amplifying circuit for a semiconductor integrated circuit can be controlled by fixing the amplification step fixing signal AMP_STEP_FIX output from the amplification step fixer 300. Further, when the number of amplifications in the data amplifying circuit is changed by appropriately adjusting the delay time of the second driving signal STB2, the output timing of the output signal OUT_SIG to be output from the semiconductor integrated circuit can be adjusted.

Specifically, the amplification step fixer 300 includes a fuse, and outputs the amplification step fixing signal AMP_STEP_FIX at a low level. The amplification controller 400 outputs the first to third control signals CTRL51 to CRTL53 in response to the first driving signal STB1, the second driving signal STB2, the test signal TEST, and the amplification step fixing signal AMP_STEP_FIX. Then, the data amplifier 200 amplifies the input signal IN_SIG in response to the first to third control signals CTRL51 to CRTL53, and outputs the output signal OUT_SIG.

That is, the amplification control signal generating unit 410 performs an OR operation with respect to the test signal TEST and the amplification step fixing signal AMP_STEP_FIX to output the amplification control signal AMP_CTRL. The delay control unit 430 outputs the second driving signal STB2 as the third driving signal STB3 when the amplification control signal AMP_CTRL is inactivated, and outputs the second driving signal STB2 delayed by the delay portion 431 as the third driving signal STB3 when the amplification control signal AMP_CTRL is activated.

The control signal generating unit 450 receives the amplification control signal AMP_CTRL, the first driving signal STB1, and the third driving signal STB3, and outputs the first to third control signals CTRL51 to CTRL53. At this time, the first driving signal STB1 is a signal that is activated when the input signal IN_SIG is primarily amplified, and the second driving signal STB2 is a signal that is activated when the primarily amplified input signal IN_SIG is secondarily amplified. Further, the third driving signal STB3 is a signal that is obtained when the amplification control signal AMP_CTRL is activated and the control signal generating unit 450 outputs the second driving signal STB2 with a time delay, or when the amplification control signal AMP_CTRL is inactivated and the control signal generating unit 450 outputs the second driving signal STB2 with no time delay. With this configuration, the activation timing of the third control signal CTRL53 can be adjusted.

As shown in FIG. 6, the control signal generating unit 450 performs an AND operation with respect to an inverted signal of the amplification control signal AMP_CTRL and the first driving signal STB1, and the inverted signal of the amplification control signal AMP_CTRL and the third driving signal STB3. Then, the control signal generating unit 450 outputs the first control signal CTRL51 and the second control signal CTRL52. Further, the control signal generating unit 450 performs an AND operation with respect to the amplification control signal AMP_CTRL and the third driving signal STB3 to output the third control signal CTRL53.

That is, if the amplification control signal AMP_CTRL is activated at a high level, the first control signal CTRL51 and the second control signal CTRL52 are inactivated at a low level, and the third control signal CTRL53 is activated or inactivated in response to the third driving signal STB3. Further, if the amplification control signal AMP_CTRL is inactivated at a low level, the first control signal CTRL51 and the second control signal CTRL52 are activated in response to the first driving signal STB1 and the third driving signal STB3, respectively, and the third control signal CTRL53 is inactivated at a low level regardless of the third driving signal STB3.

The first to third control signals CTRL51 to CTRL53 perform the same functions as the first to the third control signals CTRL1 to CTRL3 shown in FIGS. 3 and 4, and the operation of the data amplifier 200 is the same as the above-described embodiment of the invention. Accordingly, in respects to the functions and operation, the description given with reference to FIGS. 3 and 4 can be referred to.

As described above, in the data amplifying circuit for a semiconductor integrated circuit according to another embodiment of the invention, it is assumed that a case where the second amplifying unit 230 in the data amplifier 200 amplifies the input signal IN_SIG and outputs the output signal OUT_SIG is suitable for design. In this case, the fuse in the amplification step fixer 300 is disconnected to fix the amplification step fixing signal AMP_STEP_FIX to a high level, such that the amplification control signal AMP_CTRL is fixed to a high level. That is, the data amplifier 200 amplifies the input signal IN_SIG one time regardless of the test signal TEST and outputs the output signal OUT_SIG. At this time, the second driving signal STB2 is delayed and output as the third driving signal STB3, thereby adjusting the activation timing of the second amplifying unit 230. Therefore, the output timing of the output signal OUT_SIG and the inverted output signal OUT_SIGb can be adjusted.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A data amplifying circuit for a semiconductor integrated circuit, the data amplifying circuit comprising:
   a controller configured to generate a control signal for adjusting an amplification step in response to a test signal; and
   a data amplifier configured to amplify an input signal one time or two or more times in response to the control signal and to output the amplified input signal as an output signal.

2. The data amplifying circuit of claim 1,
   wherein the controller is configured to generate a first control signal in response to a first driving signal and the test signal, to output a second control signal and a third control signal in response to a second driving signal and the test signal.

3. The data amplifying circuit of claim 2,
   wherein, if the test signal is inactivated, the controller outputs the first control signal and the second control signal that are activated in response to the first driving signal and the second driving signal, respectively, and outputs the third driving signal that is inactivated.

4. The data amplifying circuit of claim 3,
   wherein, if the test signal is activated, the controller outputs the first control signal and the second control signal that are inactivated, and outputs the third control signal that is activated in response to the second driving signal.

5. The data amplifying circuit of claim 1,
   wherein the control signal includes a first control signal, a second control signal, and a third control signal, and
   the data amplifier includes
   a first amplifying unit configured to amplify the input signal in response to the first control signal, to output an amplification signal, and
   a second amplifying unit configured to additionally amplify the amplification signal in response to the second control signal and the third control signal and outputs the output signal, or amplifies the input signal and outputs the output signal.

6. The data amplifying circuit of claim 5,
wherein, as the second control signal is enabled, the second amplifying unit additionally amplifies the amplification signal and outputs the output signal, and as the third control signal is enabled, amplifies the input signal and outputs the output signal, and
if the second control signal is enabled, the third control signal is disabled.

7. The data amplifying circuit of claim 5,
wherein the second amplifying unit includes
a comparing portion configured to change potential levels of a first node and a second node in response to the second control signal and the amplification signal, or change the potential levels of the first node and the second node in response to the third control signal and the input signal, and
an output signal amplifying portion configured to amplify variations in potential of the first node and the second node, and to output the output signal.

8. The data amplifying circuit of claim 7,
wherein the comparing portion includes
a first transistor comprising a drain, a gate, to which the second control signal is input, and a source connected to a ground potential,
a second transistor comprising a gate, to which the amplification signal is input, a drain connected to the first node, and a source connected to the drain of the first transistor,
a third transistor comprising a gate, to which an inverted amplification signal is input, a drain connected to the second node, and a source connected to the drain of the first transistor,
a fourth transistor comprising a drain, a gate, to which the third control signal is input, and a source connected to the ground potential,
a fifth transistor comprising a gate, to which the input signal is input, a drain connected to the first node, and a source connected the drain of the fourth transistor, and
a sixth transistor comprising a gate, to which an inverted input signal is input, a drain connected to the second node, and a source connected to the drain of the fourth transistor.

9. The data amplifying circuit of claim 7,
wherein the output signal amplifying portion comprises a cross coupled type latch circuit configured to amplify and output the output signal in response to the voltage of the first node and the voltage of the second node.

10. The data amplifying circuit of claim 9,
wherein the output signal pairs up with an inverted output signal, the inverted output signal is output from a first output node, the output signal is output from a second output node, and the output signal and the inverted output signal have levels inverted with respect to each other.

11. A data amplifying circuit for a semiconductor integrated circuit, the data amplifying circuit comprising:
an amplification step fixer configured to output an amplification step fixing signal;
an amplification controller configured to output a control signal for adjusting an amplification step in response to a driving signal, a test signal, and the amplification step fixing signal; and
a data amplifier configured to amplify an input signal one time or two or more times in response to the control signal and to output an output signal.

12. The data amplifying circuit of claim 11,
wherein the driving signal includes a first driving signal and a second driving signal, and the control signal includes a first control signal, a second control signal, and a third control signal.

13. The data amplifying circuit of claim 12,
wherein the amplification controller includes
an amplification control signal generating unit configured to output an amplification control signal in response to the test signal and the amplification step fixing signal,
a delay control unit configured to control a transmission time of the second driving signal in response to the amplification control signal to obtain a controlled second driving signal and to output the controlled second driving signal as a third driving signal, and
a control signal generating unit configured to generate the first control signal in response to the amplification control signal and the first driving signal, and to output the second control signal and the third control signal in response to the amplification control signal and the third driving signal.

14. The data amplifying circuit of claim 13,
wherein the amplification control signal generating unit is configured to output the amplification control signal that is activated if the test signal or the amplification step fixing signal is activated.

15. The data amplifying circuit of claim 13,
wherein the amplification control signal generating unit includes an OR gate configured to receive the test signal and the amplification step fixing signal, and to output the amplification control signal.

16. The data amplifying circuit of claim 13,
wherein the delay control unit includes
a delay portion configured to output the second driving signal with a time delay for a predetermined time, and
a switching portion configured to output the second driving signal as the third driving signal in response to the amplification control signal, or to output the output from the delay portion as the third driving signal.

17. The data amplifying circuit of claim 13,
wherein, if the amplification control signal is inactivated, the control signal generating unit outputs the first control signal and the second control signal that are activated in response to the first driving signal and the third driving signal, respectively, and outputs the third control signal that is inactivated.

18. The data amplifying circuit of claim 17,
wherein, if the amplification control signal is activated, the control signal generating unit outputs the first control signal and the second control signal that are inactivated, and outputs the third control signal that is activated in response to the third driving signal.

19. The data amplifying circuit of claim 12,
wherein the data amplifier includes
a first amplifying unit configured to amplify the input signal in response to the first control signal and to output an amplification signal, and
a second amplifying unit configured to additionally amplify the amplification signal in response to the second control signal and the third control signal and to output the output signal, or to amplify the input signal and output the output signal.

20. The data amplifying circuit of claim 19,
wherein the second amplifying unit includes
a comparing portion configured to change potential levels of a first node and a second node in response to the second control signal and the amplification signal, or to change the potential levels of the first node and the second node in response to the third control signal and the input signal, and an output signal amplifying portion configured to amplify variations in potential of the first node and the second node, and to output the output signal.

21. The data amplifying circuit of claim 11,
wherein the amplification step fixer is configured to fix the amplification step fixing signal to a specific level in response to a test result and to output the amplification step fixing signal at the specific level.

* * * * *